United States Patent [19]
Shibata et al.

[11] Patent Number: 5,580,432
[45] Date of Patent: Dec. 3, 1996

[54] JIG FOR ELECTROPLATING LEAD PINS OF AN INTEGRATED CIRCUIT PACKAGE

[75] Inventors: Takahiro Shibata; Futoshi Sonoda; Kazuo Kimura; Tomio Satou; Koichi Ishikawa, all of Nagoya, Japan

[73] Assignee: NGK Spark Plug Co., Ltd., Nagoya, Japan

[21] Appl. No.: 448,859

[22] Filed: May 24, 1995

Related U.S. Application Data

[62] Division of Ser. No. 198,359, Feb. 18, 1994, Pat. No. 5,459,102.

[30] Foreign Application Priority Data

| Feb. 19, 1993 | [JP] | Japan | 5-055093 |
| Jul. 8, 1993 | [JP] | Japan | 5-194088 |
| Jul. 9, 1993 | [JP] | Japan | 5-194321 |
| Jul. 10, 1993 | [JP] | Japan | 5-194150 |
| Dec. 21, 1993 | [JP] | Japan | 5-346226 |

[51] Int. Cl.⁶ ............................................. C25D 17/04
[52] U.S. Cl. .................. 204/297 R; 205/122; 205/123
[58] Field of Search ............................ 205/122, 123; 204/285, 297 R

[56] References Cited

U.S. PATENT DOCUMENTS

| 4,362,991 | 12/1982 | Carbine | 324/158 P |
| 5,022,976 | 6/1991 | Roll et al. | 204/297 R |
| 5,087,331 | 8/1992 | Roll et al. | 205/118 |
| 5,240,588 | 8/1993 | Uchida | 437/218 |
| 5,342,992 | 8/1994 | Noto | 174/52.4 |

FOREIGN PATENT DOCUMENTS

| 61-56429 | 3/1986 | Japan |
| 1-115153 | 5/1989 | Japan |
| 1-168049 | 7/1989 | Japan |
| 1-119058 | 8/1989 | Japan |
| 4-267362 | 9/1992 | Japan |
| 4-286131 | 10/1992 | Japan |
| 5-13640 | 1/1993 | Japan |
| 5-6908 | 1/1993 | Japan |

*Primary Examiner*—John Niebling
*Assistant Examiner*—Brendan Mee
*Attorney, Agent, or Firm*—Foley & Lardner

[57] ABSTRACT

Disclosed is a method of producing an integrated circuit package, wherein portions of the package are electroplated by getting a direct electrical connection with each of lead pins joined to a package substrate. The electrical connection is obtained by force-fitting each of the lead pins in corresponding one of openings formed in a plating jig made of an electrically conductive material for thereby bringing a side surface of each of the lead pins in contact with the jig. The portions of the package are electroplated under the condition where each of the lead pins is held in conduction. After the electroplating, each of the lead pins is separated from the jig through movement in the direction differing from an axial direction of each of the lead pins. Various jigs used for carrying out the above method are also disclosed.

17 Claims, 17 Drawing Sheets

JIG FOR ELECTROPLATING LEAD PINS OF AN INTEGRATED CIRCUIT PACKAGE

This application is a division, of application Ser. No. 08/198,359, filed Feb. 18, 1994 now U.S. Pat. No. 5,459,102.

BACKGROUND OF THE INVENTION

1. Field of the Invention

The present invention relates to a method of producing an integrated circuit package. Further, the present invention relates to a jig for carrying out such a method.

2. Description of the Prior Art

In production of a plug-in type package, a representative of which is a pin grid array (PGA) type, a number of lead pins (i.e., terminals for connection with the external circuit) made of 42 alloy (Fe-Ni alloy) or Koval are brazed to the package and thereafter electroplating of Ni or Au is applied to the lead pins and the bonding pad portions or the like portions of the package to improve the corrosion resistance and the electrical conductivity. In order to carry out such an electroplating process, it is a known technique to get a necessary electrical connection with each lead pin. In this instance, it is required to get a direct electrical connection with all of the lead pins which are electrically independent from each other.

An example of a technique for attaining such electrical connection of the lead pins is disclosed in Japanese Patent Provisional Publication No. 4-286131. The technique disclosed by this publication relates to a jig for carrying the plating. The jig is formed from an electrically conductive metal film or sheet in which a plurality of slits of the shape having a plurality of slit portions arranged radially like a starfish are formed and arranged at a pitch corresponding to that of the leads pins of the package. Each lead pins are pushed into the central portions of the slits and thereby held in contact with the inner peripheries of same under pressure. By this, an electrical connection necessary for the electroplating can be obtained with each lead pin. In this state of being fitted with such a jig, the package is immersed in the plating tank containing the plating solution, and a necessary setting such as connection of the jig to the cathode is made. By allowing a predetermined current to pass through the jig, the lead pins, etc., various package portions can be processed by electroplating at one time.

A problem of the prior art jig is that each of its opening portions is adapted to contact the side surface of each lead pin at three or more places. Such places remain not plated or coated after the plating process. The area of the not-plated places is relatively large, thus deteriorating the corrosion resistance of the package and therefore the quality and the ability of same.

Another problem is that the jig has a difficulty in setting, i.e., it requires much time to align the ends of so many lead pins with the central portions of the slits.

A further problem is that the plated surface of the lead pins are liable to be damaged by the jig when the jig is drawn off from the lead pins.

SUMMARY OF THE INVENTION

According to an aspect of the present invention, there is provided a method of producing an integrated circuit package, wherein portions of the package are electroplated by getting a direct electrical connection with each of lead pins joined to a package substrate, characterized in that the electrical connection is obtained by bringing a side surface of each of the lead pins in contact with a plating jig made of an electrically conductive material, the portions of the package are electroplated under the condition where each of the lead pins is held in conduction, and thereafter each of the lead pins is separated from the jig through movement in the direction differing from an axial direction of each of the lead pins.

According to another aspect of the present invention, there is provided a plating jig used for carrying out the above described method. The jig is formed from a sheet of metal and comprises a plurality of openings arranged correspondingly to the lead pins. Each of the openings consists of a loose-fit opening section in which each of the lead pins can be held loose and a force-fit opening section in which each of the lead pin can be force-fitted.

The method and jig are effective for solving the above noted problems inherent in the production of a prior art integrated circuit package.

It is accordingly an object of the present invention to provide a method of producing an integrated circuit package, which makes it possible to obtain an integrated circuit package of a high quality and ability.

It is a further object of the present invention to provide a jig for carrying out the method of the above described character.

BRIEF DESCRIPTION OF THE DRAWINGS

FIG. 26A is an enlarged, fragmentary sectional view of a jig according to a further embodiment of the present invention, in which

DETAILED DESCRIPTION OF THE PREFERRED EMBODIMENTS

Figure 1B:
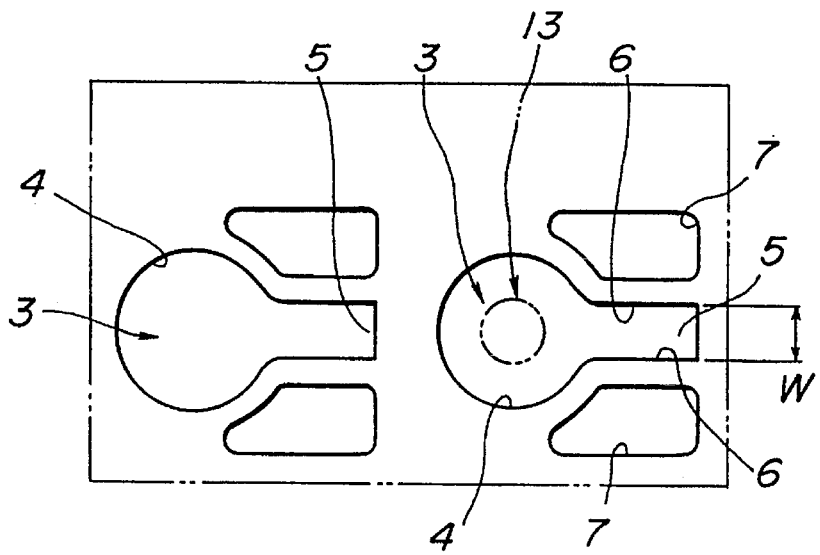
FIG. 1A is a plan view of a plating jig according to an embodiment of the present invention, with FIG. 1B shows a portion A of the jig in an enlarged scale.
Figure 1A:
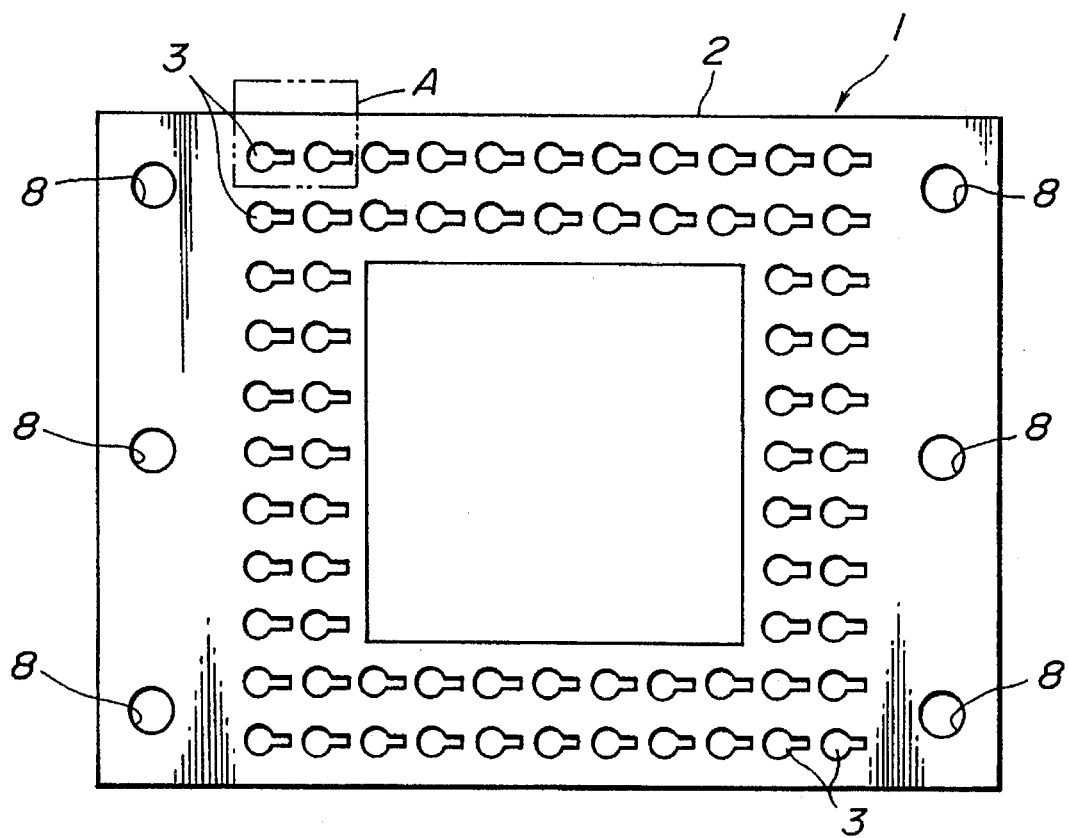

Referring to FIGS. 1A–B, a plating jig will first be described. The plating jig 1 according to an embodiment of the present invention is formed from an elastic or resilient sheet 2 of 42 alloy (Fe-Ni alloy) and of the thickness of about 0.1 mm. The jig 1 has at its central portion a punched out square opening and is thus shaped into the form of a rectangular open frame. The central portion of the jig 1 coincides with a cavity of a package 11 for receiving therein an integrated circuit chip (not shown). The jig 1 is formed, at its entire area and by etching or punching out in a press, with a number of openings 3 which are arranged at predetermined lengthwise and breadthwise pitches corresponding to the arrangement of lead pins 13 of the package 11.

That is, each opening 3 consists of a loose-fit opening section 4 for receiving each lead pin 13 loosely or movably and a force-fit opening section 5 for fittingly receiving the lead pin 13 when the lead pin 13 is moved radially or sideways thereof from the loose-fit opening section 4 to the force-fit opening section 5. In this embodiment, the loose-fit opening section 4 is formed into a nearly circular shape having a diameter larger than that (0.41 mm) of the lead pin 13, whilst the force-fit opening section 5 is formed into a narrow, elongated shape extending from the loose-fit opening section 5 in one radial direction thereof, i.e., rightwards in the drawing, and having a uniform width which is smaller than the diameter of the lead pin 13. Each opening 3 thus has a keyhole-like shape. In this connection, the opening 3 in this embodiment has such dimensions that the inner diameter of the loose-fit opening section is 1.2 mm and the width "W" of the force-fit opening section 5, i.e., the distance between the edges 6 is smaller than the outer diameter of the lead pin 13 by from 0.01 mm to 0.1 mm. In the meantime, though omitted in the general view portion of FIG. 1A, there are formed at the opposed sides of each opening 3, as shown in an enlarged view portion of FIG. 1B, a pair of vacant openings 7 and 7 which are arranged in a window-like fashion. The vacant opening 7 and 7 are located adjacently outside of the edges 6 and 6 of the force-fit opening section 5 and each have a nearly trapezoidal shape so that the edges 6 and 6 of the force-fit opening section 5 can deflect or resiliently bent outside. In the meantime, a plurality of openings 8 formed in the lengthwise end portions (i.e., the left-hand and right-hand end portions) of the resilient sheet 2 are used for fixation of the jig 1 at the time of force-fitting of the each pins 13.

Figure 2:
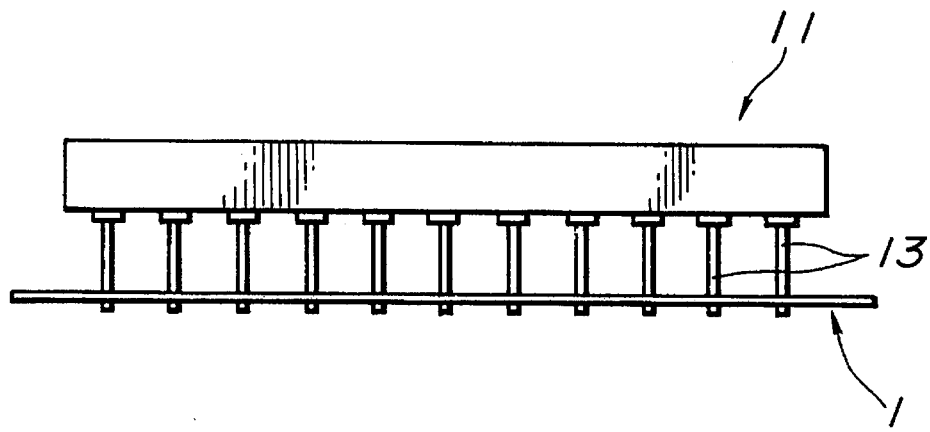
FIG. 2 is a side elevational view, in a reduced scale, of the plating jig of FIG. 1 installed on a package which is to be processed by electroplating.
Figure 3A:
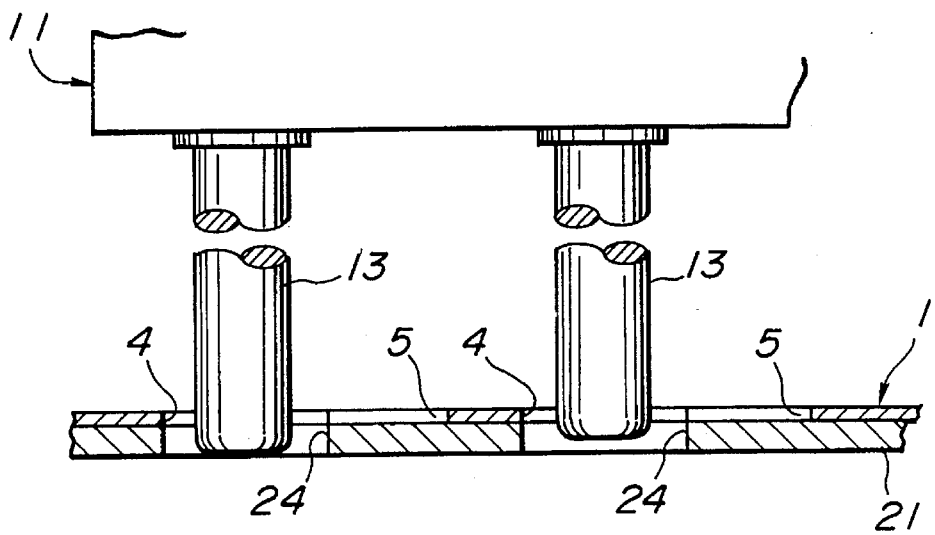
FIGS. 3A to 3C are enlarged, fragmentary sectional views of the plating jig and the package of FIG. 2 for illustrating the process for pushing lead pins radially or sideways thereof and force-fitting the lead pins in the force-fit opening sections of the openings of the jig, respectively.
Figure 4A:
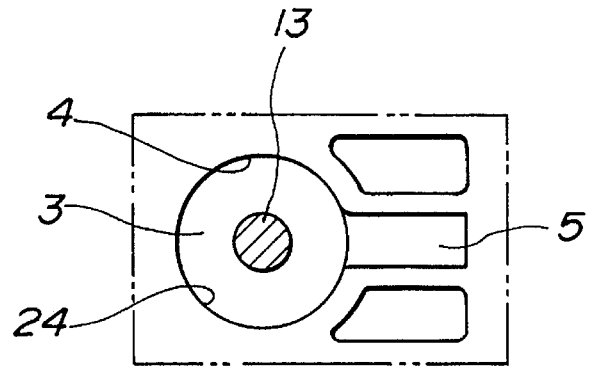
FIGS. 4A to 4C are plan views corresponding to FIGS. 3A to 3C, respectively.

Electrical connection of the lead pins 13 by using the plating jig 1 will now be described. Firstly, as shown in FIG. 2, the end portions of the lead pins 13 of the package 11 are aligned with the loose-fit opening sections 4 of the respective openings 13 and inserted thereinto, whereby the package 11 is set or positioned in place relative to the jig 1. Then, the jig 1 is fixedly attached to a stationary member (not shown). After the jig 1 is fixed, the package 11 is moved sideways in the following manner. That is, as shown in FIGS. 3A and 4A, a slider 21 formed with loose-fit openings 24 of the same size and arrangement with the loose-fit opening sections 4 of the jig 1, is placed on a base (not shown). The jig 1 is placed on the slider 24 in such a manner that the loose-fit opening sections 4 are aligned with the corresponding loose-fit openings 24, respectively. The jig 1 is fixedly attached to the base by means of a fixing means (not shown). The package 11 is set in such a manner that each lead pin 13 is positioned substantially concentric with the corresponding loose-fit opening section 4.

Figure 3B:
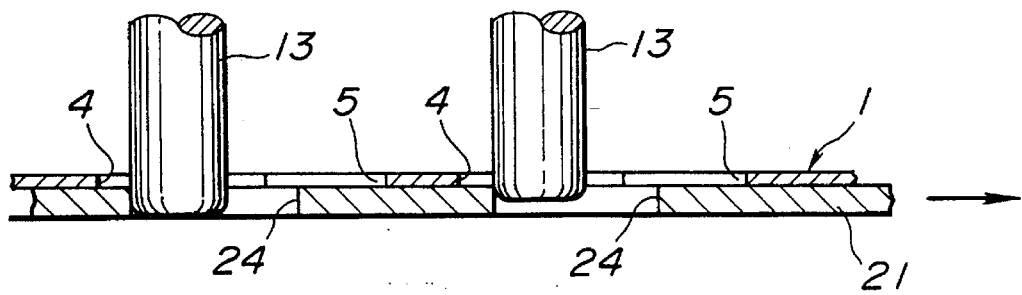
Figure 3C:
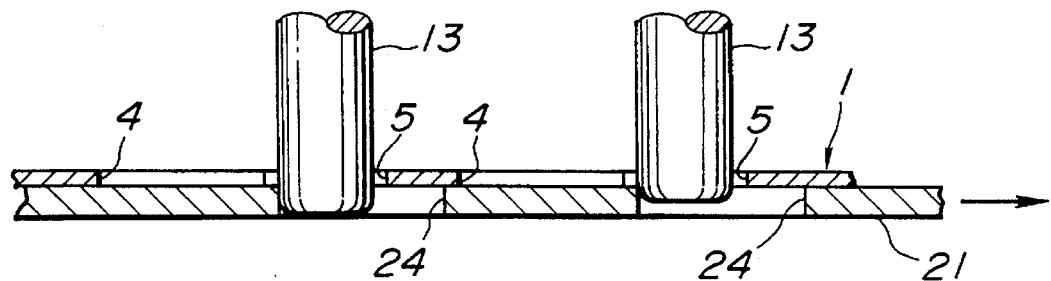
Figure 4B:
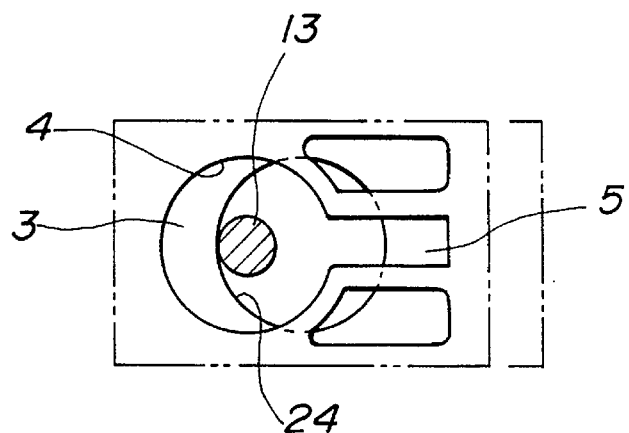
Figure 4C:
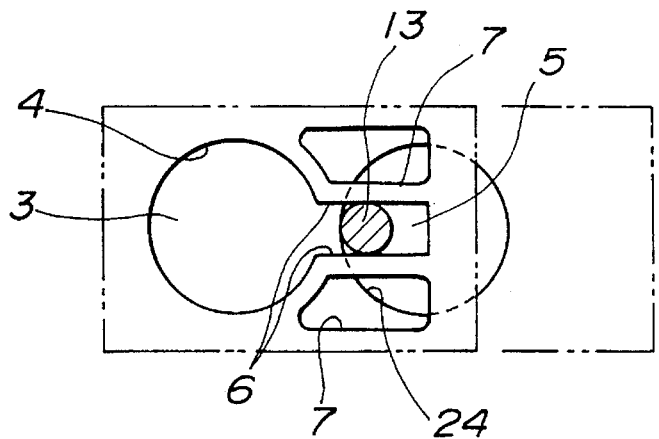

Then, the slider 21 is moved toward the force-fit opening section 5 of the opening 3 of the jig 1 (to the right in FIGS. 3 and 4). Thus, each loose-fit opening 24 comes in contact at one side (i.e., left-hand side in the drawing) with the left-hand side of the end portion of the corresponding lead pin 13 (refer to FIGS. 3B and 4B). When the slider 21 is further moved a predetermined distance in the same direction, each lead pin 13 is pushed or driven radially thereof by the slider 21 and forced to fit in the force-fit opening section 5 through movement sideways of the force-fit opening section 5 (refer to FIGS. 3C and 4C). In this instance, the edges 6 of the force-fit opening section 5 are pushed outward so that the distance therebetween becomes a little wider, due to the resilience by the provision of the vacant openings 7 adjacently outside of the edges 6 of the force-fit opening section 5. In the above manner, each lead pin 13 is forced to contact at two opposed side surface points or portions with the edges 6 of the force-fit opening section 5, whereby electrical connection between the lead pins 13 and the jig 1 is obtained. In the meantime, in FIGS. 3A to 3C, the lower terminal ends of the lead pins 13 are shown in different positions in order to show an error in the length of the lead pins 13 in an exaggerated manner.

Figure 5:
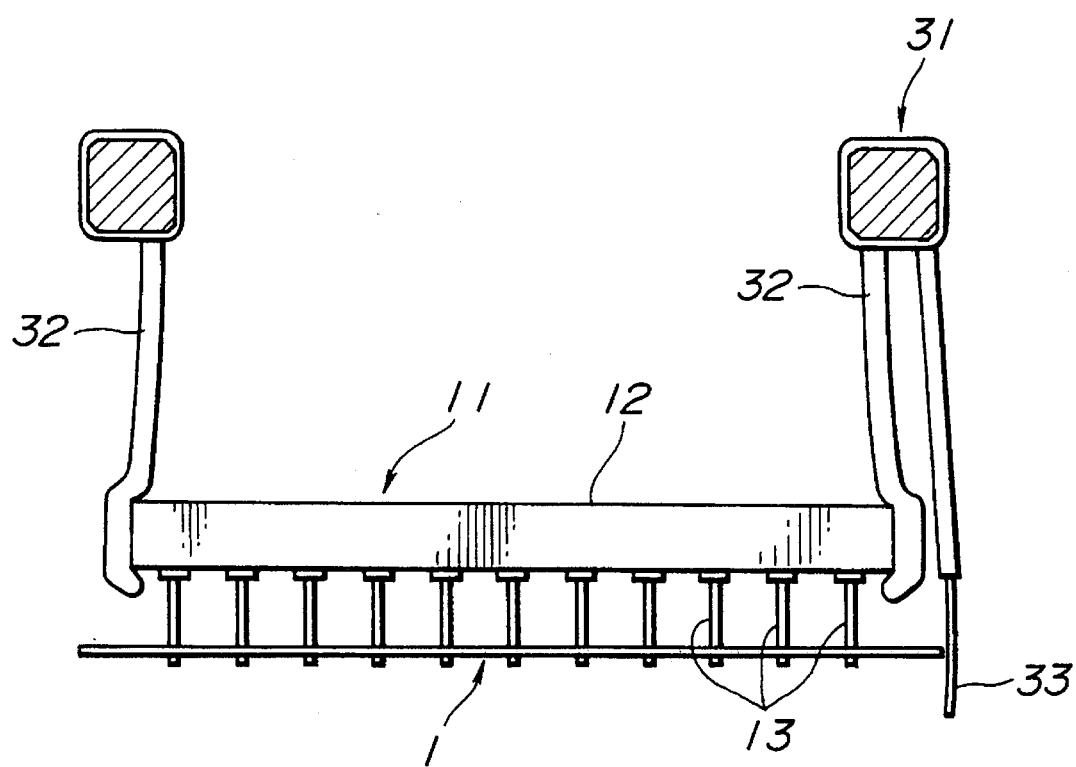
FIG. 5 is a schematic view of the jig and the package in the state that the lead pins of the package are force-fitted in the openings of the jig, together with a plating rack to which the jig and package are electrically connected.
Figure 6:
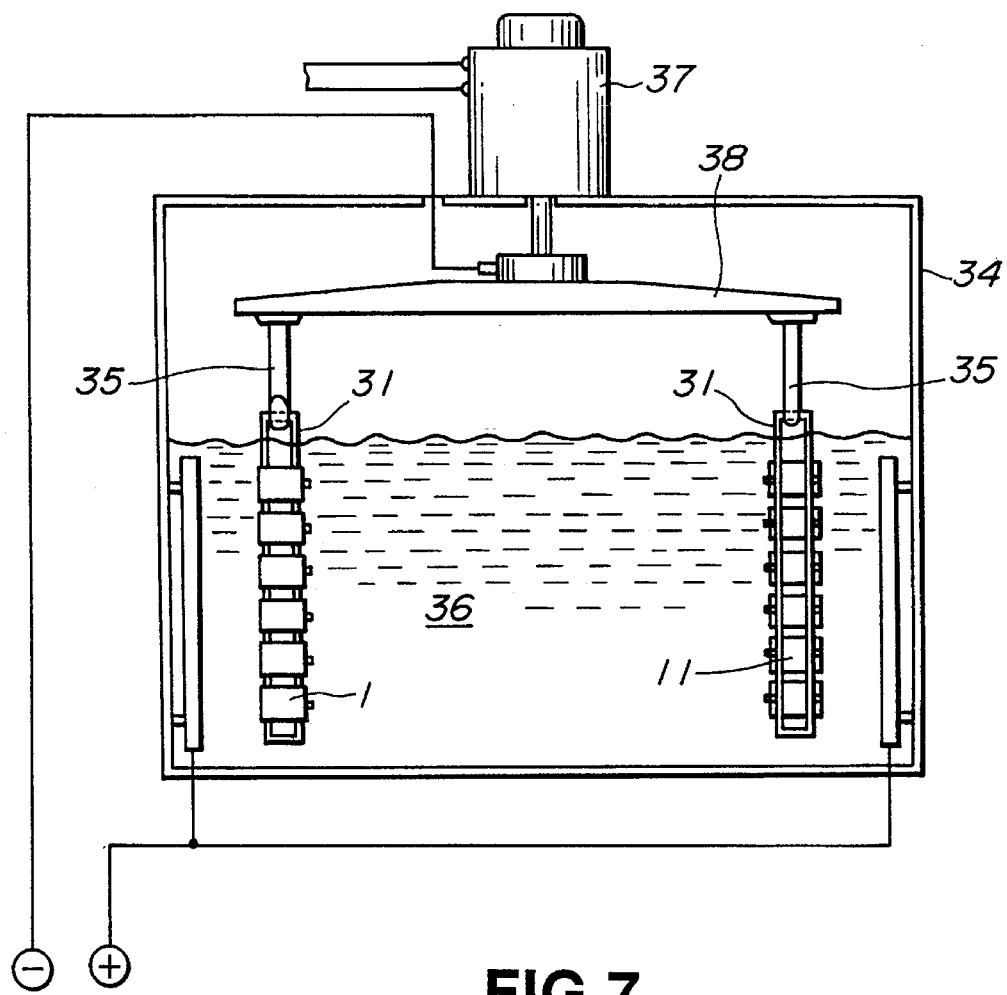
FIG. 6 is a schematic view of the jig and the package of FIG. 1, in a state of being installed on the plating rack and held in the plating tank.

Thus, after the lead pins 13 are force-fitted in the jig 1, the jig 1 is connected with an external power source (cathode) in the same manner as the conventional electroplating process and held together with the package 11 in a plating tank containing a plating solution to conduct an electroplating operation by application of current thereto. That is, as shown in FIG. 5, the package 11 is carried on a cathode rack 31 by being clamped or fixedly held at its substrate 12 by resilient arms 32 of the cathode rack 31. A suitable number of packages 11 are carried on the cathode rack 31. A cathode bar 33 protruding from the cathode rack 31 is brought into contact with the periphery of the jig 1 under pressure for thereby attaining electrical connection therebetween. As shown in FIG. 6, the rack 31 carrying thereon the packages 11 is hung on a hook 35 and immersed in the plating solution 36 to perform Ni-plating or Au-plating. In the meantime, in FIG. 6, the hook 35 is attached at its upper end to a support plate 38 which is in turn fixedly attached to a shaft of a motor 37 so that the rack 31 carrying the works to be plated are rotated in the plating solution 36 to obtain a uniform and efficient plating operation.

By the above plating process, various portions of the package 11, i.e., the lead pins 13, a package substrate portion on which an integrated circuit chip is to be installed, bonding pad portions and a wiring pattern are plated at one time. At a later process, a force is applied to each lead pins 13 in the opposite direction to the force for the force-fitting so as to drive the lead pins 13 sideways or radially thereof, whereby to move the lead pins 13 from the force-fit opening sections 5 to the loose-fit opening sections 4 so that the lead pins 13 are loose in the openings 3 and thus disconnected from the jig 1. Thereafter, the lead pins 13 are drawn axially from the jig 1 to be separated therefrom. At this time of removal of the jig 1 from the lead pins 13, the plating applied to the side or circumferential surface of each lead pin 13 is not scratched by the edges 6 of the jig 1 along a generatrix of the lead pin 13 and thus assuredly prevented from damage, thus making it possible to obtain a desired package assuredly. In the meantime, in connection with each opening 3 of the jig 1 shown in FIG. 1, the force-fit opening section 5 may be shaped wider at an innermost portion thereof so that the lead pin 13 is loose in the innermost portion. When this is the case, i.e, the opening 3 is of the kind including two loose-fit opening sections 4 at the opposite ends of the force-fit opening section 5, removal of the lead pins 13 from the jig 1 can be attained by movement of the lead pin 13 in the same direction as the movement for the force-fitting.

In this embodiment, each lead pin 13 is force-fitted in the force-fit opening section 5 of the opening 3 formed in the jig 1 made of an electrical conductive material, for thereby being brought into contact with the jig 1, thus making it possible to attain a desired electrical connection with a high reliability. Thus, it becomes possible to prevent a defective plating such as the existence of a lead pin which is not plated, efficiently.

In the package produced in the above manner, each lead pin 13 has adjacent the terminal ends two radially opposed circumferential surface portions which are not plated. However, since the lead pins 13 are removed from the jig 1 through movement sideways thereof, the plating around the not-plated portions is not damaged. The non-plated portions are quite small and nearly rectangular. In this connection, in order to reduce the area of the not-plated portions, the thickness of the jig of itself can be reduced. In the meantime, the not-plated portions of the side or circumferential surface of each lead pin are the places where the lead pin is brought into contact with the jig at a plating process, so the placed where the not-plated portions are formed are not limited to the places adjacent the free end of the lead pin but can be moved to the axially intermediate places or to the places adjacent to the fixed end. However, it is desirable to arrange the not-plated portions adjacent the free end of the lead pin since from the point of view of the breakage strength it is desirable that the not-plated portions are positioned as far as possible from the fixed end of the lead pin.

While it has been described and shown that the lead pin is moved sideways for contact with the jig, this is not for the purpose of limitation but each pin 13 can be pushed axially into the force-fit opening section 5 of the corresponding opening 3. In the present invention, it will do that the direction of removal of the lead pins from the jig differs from the axial direction of the lead pin, i.e., the lead pins are removed from the jig through movement in the direction transversal to the axial direction of the lead pin. However, it is desirable to remove each lead pin from the jig by moving the lead pin in the direction as close as possible to the direction perpendicular to the axis of the lead pin.

In the meantime, the jig 1 shown in FIG. 1B has the vacant openings 7 adjacently outside of the edges 6. Due to this, at the time of the force-fitting of the lead pins 13, the edges 6 are deflected or resiliently bent outwards, thus making it possible to attain the force-fitting and removal of the lead pins with ease. By this, the plastic or permanent deformation of the jig 1 can be prevented, so the jig 1 is suitable for repeated use, and stable and assured electrical connection between the jig 1 and the lead pins 13 can be attained. In the meantime, the vacant opening 7 can be formed only on one side of the force-fit opening section 5 (refer to FIG. 7), i.e., outside of only one edge 6. By the provision of the vacant openings 7, the recirculation of the plating solution in the plating tank is improved, thus making it possible to attain an efficient plating operation. Further, the amount of the plating solution taken out of the tank together with the jig due to adhesion thereto can be reduced, thus making it possible to elongate the life of the plating solution.

The thickness of the jig 1 according to this embodiment is 0.1 mm. The suitable thickness, however, can be within the range from 0.05 mm to 0.2 mm when the jig 1 is made of 42 alloy. When the thickness is smaller than 0.05, the jig becomes insufficient in strength and cannot exert a sufficient force for retaining the package or lead pins. On the other hand, when the thickness becomes larger than 0.2 mm, the not-plated portions at the end portions of the lead pins 13 becomes so large. So, it is desirable to select the thickness of the jig from the above described range depending upon the size and specification of the package. Further, when the width of the force-fit opening section is too small relative to the outer diameter of the lead pin, a difficulty in the force-fitting and removal of the jig is caused. So, a suitable interference is set depending upon the material, the thickness, whether the edges of the opening section are resiliently deformable outward or not, etc.

Figure 7:
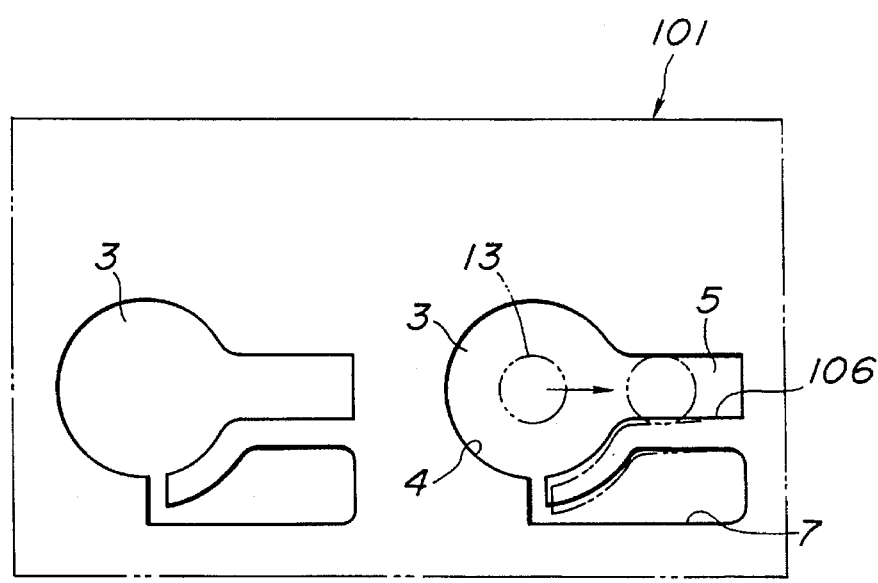
FIGS. 7 to 11 are enlarged plan views of various shapes for an opening of a plating jig according to further embodiments Of the present invention.

In the meantime, the jig used in case of attaining the electrical connection between the lead pins and the jig by force-fitting the former to the latter, may be formed as shown in FIG. 7. According to this embodiment, a sheet portion of the jig 106 located between the loose-fit opening section 4 and an end portion of the vacant opening 7 is cut out so that one of the edges 106 extending along the force-fit opening section 5 is formed into a cantilever-like shape and can resiliently bent outward. Since the edge 106 has a cantilever-like shape, it can be deflected or bent more easily, thus making it possible to attain the fitting and removal of the lead pins 13 more smoothly. Further, the cantilever-like shape is more desirable in case the lead pins are pushed axially thereof for contact with the jig. In the meantime, both of the edges of the force-fit opening section may be formed into a cantilever-like shape in the manner described above. In this connection, the cut out portions between the loose-fit opening section and the vacant opening can be set variously in accordance with the necessity.

Figure 8:
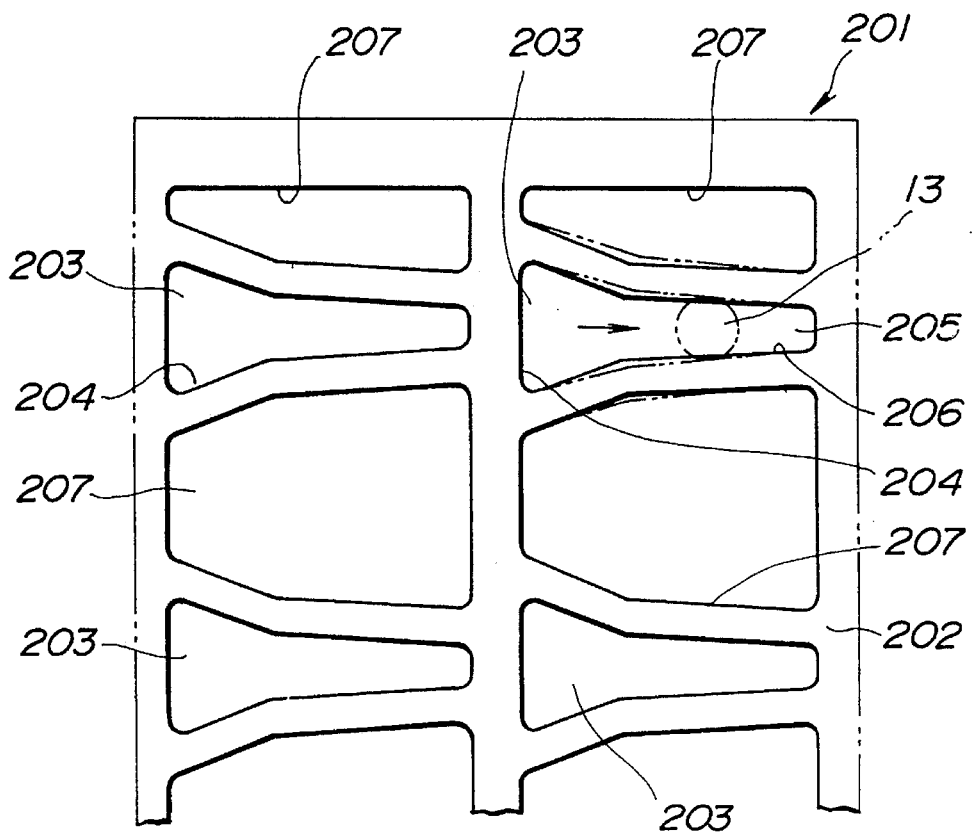

Further, while a jig having a force-fit opening section of a uniform width has been described and shown as above, it may have a tapered force-fitting opening section as shown in FIG. 8. Referring to FIG. 8, the jig 201 has an opening 203 consisting of a loose-fit opening section 204 and a force-fit opening section 205. The loose-fit opening section 204 has a trapezoidal shape and is tapered toward the force-fit opening section 205. In the loose-fit opening section 204, the lead pin 13 is held loose or movable. The force-fit opening section 205 is in the form of a narrow, elongated opening and is tapered in the direction away from the loose-fit opening section 204 and more gradually than the same. That is, the force-fit opening section 205 is tapered a little or gradually in the direction in which the lead pin 13 is moved for the force-fitting. Similarly to the case described with respect to the embodiment of FIGS. 1A–B, when each lead pin 13 is moved in the direction of the arrow in FIG. 8, the side or circumferential surface of the lead pin 13 is brought into contact with the edges 206 as shown by the two-dot chain lines whilst causing the edges 206 to be deflected outwards such that the lead pin 13 is force-fitted in the force-fit opening section 205. In this instance, since the force-fit opening section 205 is tapered, the lead pin 13 can be forced to fit in the force-fit opening section 205 relatively easily and can be forced to contact the edges 206 firmly by the effect of the wedged arrangement of the same, thus making it possible to attain a high electrical connection. Accordingly, removal of the jig during the plating process can be prevented assuredly. In the meantime, in case of separation of the lead pins 13 form the jig 201, the lead pins 13 are moved relative to the jig 201 from the force-fit opening section 205 to the loose-fit opening section 204 similarly to the jig 1 shown in FIGS. 1A–B. In this instance, it is not necessarily required to move the lead pins 13 radially or sideways thereof but it will do to move the lead pins 13 in the direction differing from the axial direction thereof.

In the meantime, in case of the jig shown in FIG. 8, vacant openings 207 are formed along the respective edges 206, the sheet member 202 are actually comprised of only ribs for forming the openings 203 and the vacant openings 207, so that the recirculation of the plating solution can be so good, the uniform thickness of the plating and the control thereof can be attained with ease. Further, the taking out of the plating solution due to the adhesion to the plating jig 201 can be reduced. In the meantime, while the force-fit opening section 205 is shown as tapering linearly, it may taper curvedly. Further, the tapering angle may be set suitably according to the necessity but a desirable tapering angle is within the range from 1 to 5 degrees.

Figure 9:
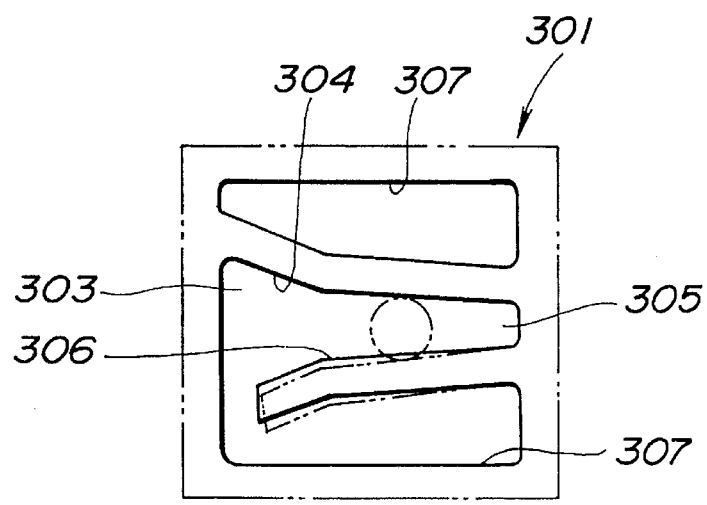
Figure 10:
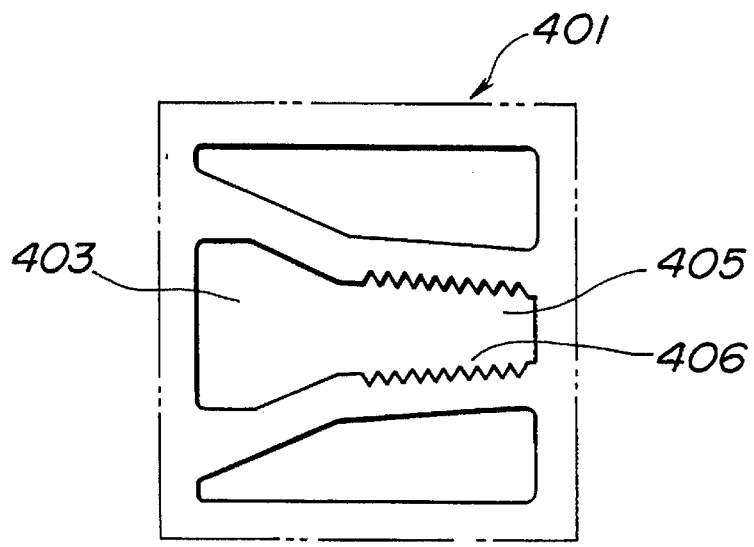
Figure 11:
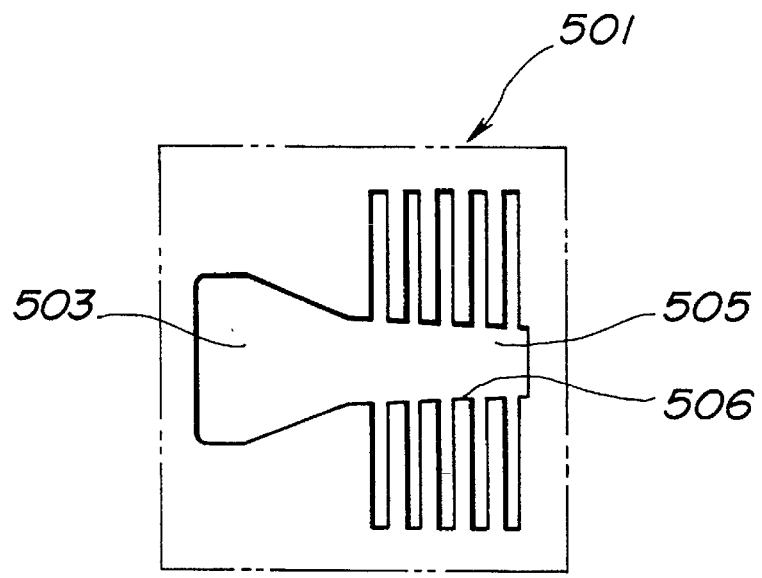

FIGS. 9 to 11 show variants of the jig shown in FIG. 8. In the variant shown in FIG. 9, the wall portion of the jig 301 between the loose-fit opening section 304 of the opening 303 and the vacant opening 307 is cut out so that the edge 306 of the force-fit opening section 305 is formed into a cantilever-like shape and is capable of bending outwards. In the variant shown in FIG. 10, the edge 406 of the force-fit opening section 405 is sawtoothed or serrated. By this, the contact resistance caused at the time of force-fitting of each lead pin into the opening 403 of the jig 401 can be reduced, so the force-fitting can be attained with ease and further the area of not-plated portions can be decreased. In this connection, as shown in FIG. 11, the edge 506 of the force-fit opening section 505 can be formed into a comblike shape, i.e., the edge 506 of the opening 503 of the jig 501 can have such a shape like the teeth of a comb to attain the same effect. In the meantime, in case of any one of the jig shown in FIGS. 9 to 12A–B, the force-fitting of each lead pin to the jig can be attained by pushing the lead pin axially thereof or in the direction different from the axial direction.

In the foregoing, while the force-fitting of each lead pin in the jig has been described and shown as being attained by pushing the lead pin radially or sideways for thereby allowing the side or circumferential surface of the lead pin to be forced to fit in the force-fit opening section of the jig or forced to contact the jig or adhere the jig to attain the electrical connection, any contact between the side surface of the lead pin and the jig will do if the electrical connection necessary for the electroplating can be attained.

Figure 12A:
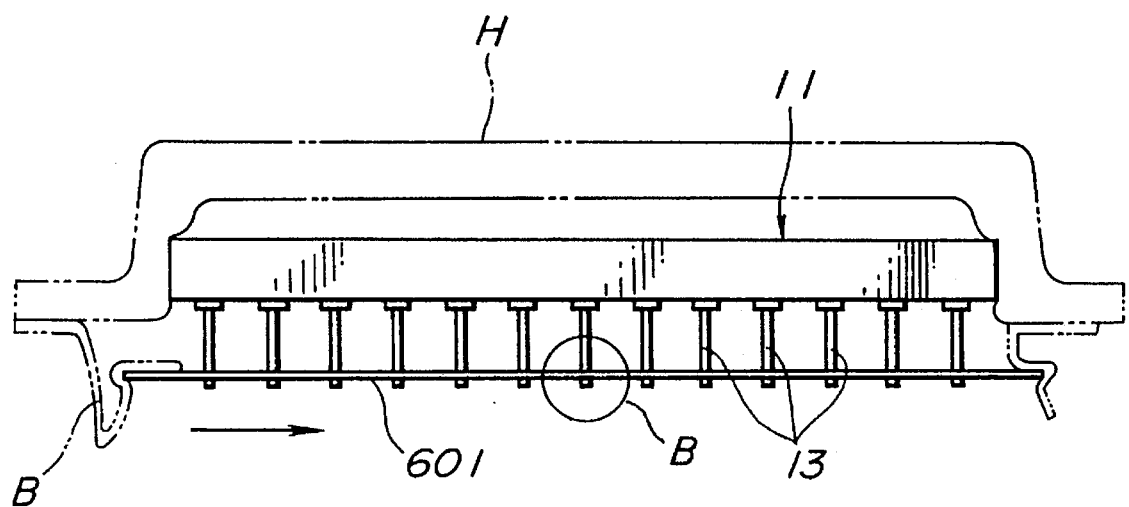
FIG. 12A–B are side elevational views for illustration of a means for holding the jig forcedly in contact with the package without fitting the lead pins into the jig, with FIG. 12B showing portion B of FIG. 12A in an enlarged view.
Figure 12B:
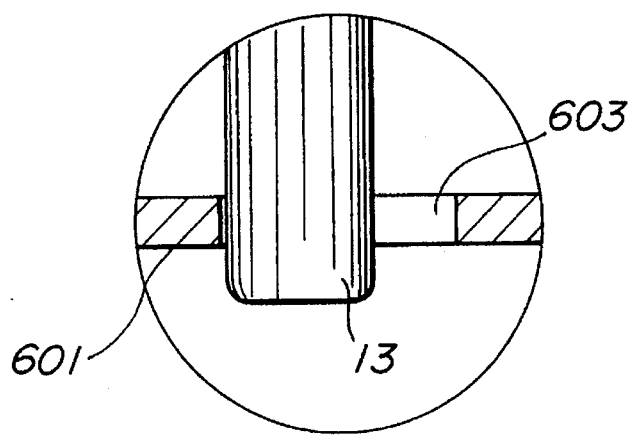

For example, in connection with the jig shown in FIGS. 1A–B it will do to reduce the width "W" of the force-fit opening section 5 (i.e., the distance between the edges 6) so as not to allow the insertion of the lead pin 13 into the force-fit opening section 5 or to make the same width "W" larger than the diameter of the lead pin 13 so that the side surface of each lead pin is not force-fitted in the force-fit opening section 5 but simply in contact with or pushed against the jig, if the electrical connection necessary for the electroplating can be attained. In the meantime, after the electroplating, each lead pin is released from the pushing force and moved in the direction different from the axial direction thereof for separation from the jig. In the meantime, in case, for example, in connection with the jig in FIGS. 1A–B, the opening 3 is formed into a circular shape of the diameter larger than that of the lead pin so that the side surface of the lead pin is put simply in contact with a portion of the circular edge, the package (lead pins) and the jig are subjected to forces for maintaining the contact therebetween during the plating process by using a suitable means. For example, as shown in FIGS. 12A–B, the package 11 is held by a holder "H" whilst the jig 601 is urged in the direction of the arrow, i.e., radially or sideways of the lead pins 13 by means of a spring "B", whereby the side surface of each lead pin 13 and the circular edge of the opening 603 of the jig 601 can be held forcedly in contact with each other.

In the meantime, the present invention is applicable to such a case wherein only the lead pins located at the four corners of the package are adapted so as to be forced to fit in the force-fit opening section of the opening as shown in FIG. 1A for thereby being held in contact with the jig whilst holding the jig thereon by the effect of the force-fitting, whereas the remaining lead pins are put simply in contact with the jig as shown in FIG. 13, i.e., the case where in the same package some lead pins are force-fitted in the jig whereas some lead pins are not force-fitted but simply in contact with the jig.

Figure 13A:
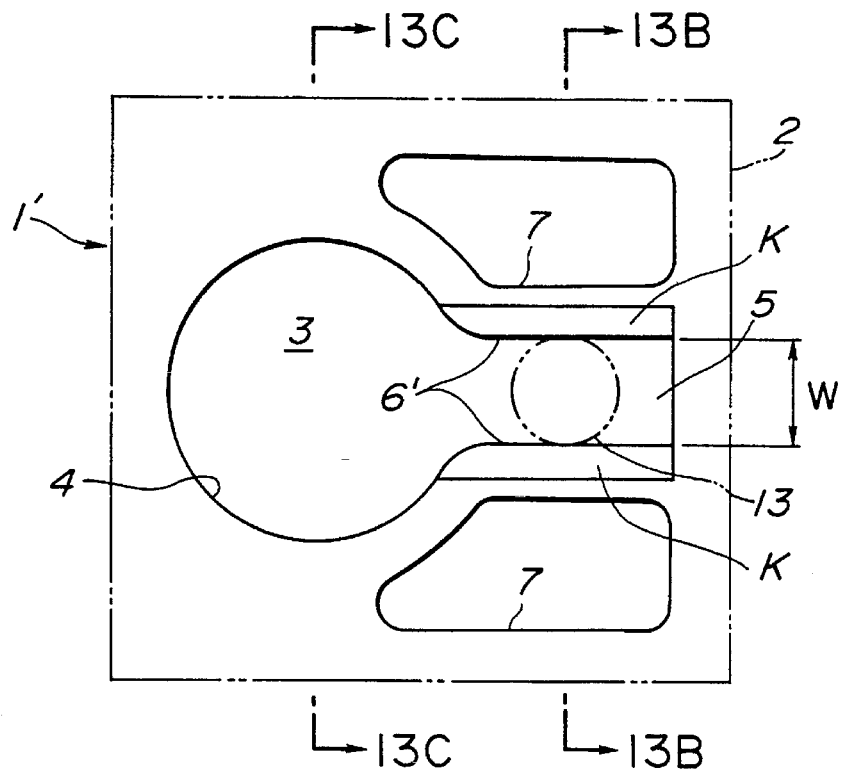
FIG. 13A is a view similar to FIG. 4A but shows a further embodiment of the present invention.
Figure 13B:
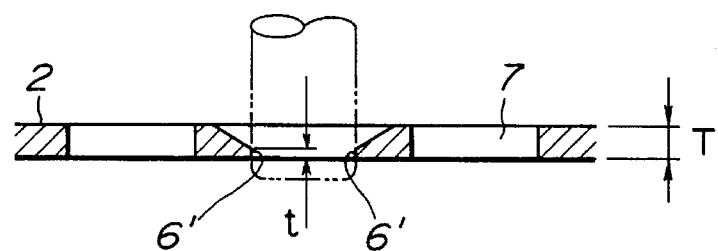
FIGS. 13B and 13C are sectional views taken along the lines 13B—13B and 13C—13C of FIG. 13A, respectively.
Figure 13C:
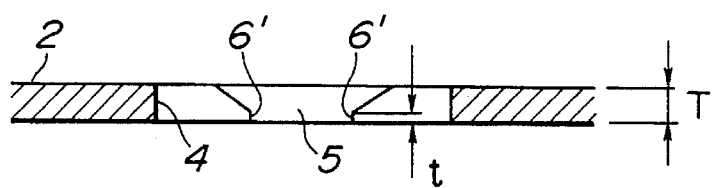

In FIGS. 13A to 13C, a jig 1' according to a further embodiment of the present invention is shown. In this embodiment, the edges 6' of the force-fit opening section 5 brought into contact with the side surface of the lead pin 13 have the thickness "t" which is smaller than the thickness "T" of the sheet member 2 forming the jig 1', i.e. ,. the edges 6' are shaped into the form of a knife edge or a wedge in order to attain the electrical connection more assuredly. This can improve the contact or adherent ability of the jig 1' with respect to the lead pins 13, so that not only the more assured electrical connection can be attained but the area of the portions which are not plated can be reduced.

Figure 14A:
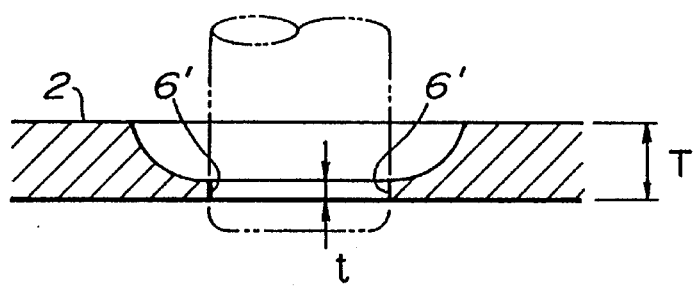
FIGS. 14A to 14E are view similar to FIG. 13B but shows further embodiments of the present invention, with FIG. 14E showing the enlarged portion C of FIG. 14D.
Figure 14B:
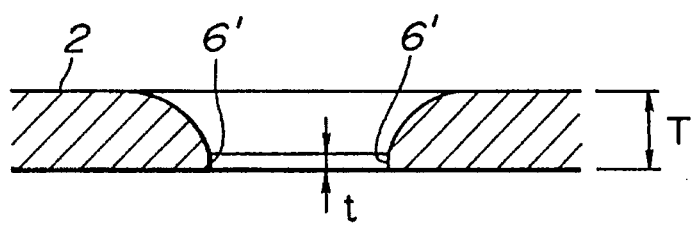
Figure 14C:
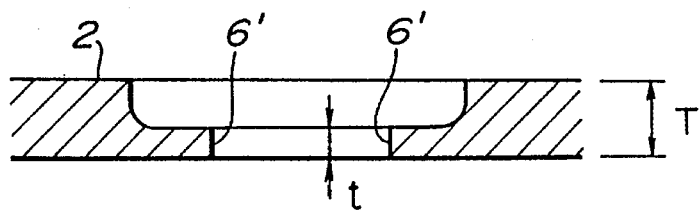
Figure 14D:
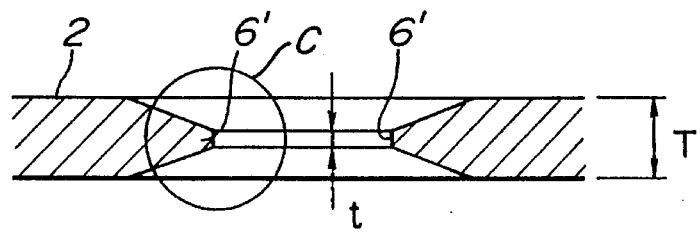
Figure 14E:
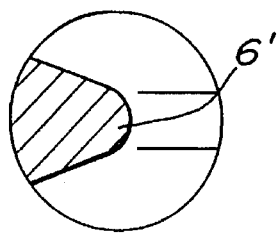
Figure 15:
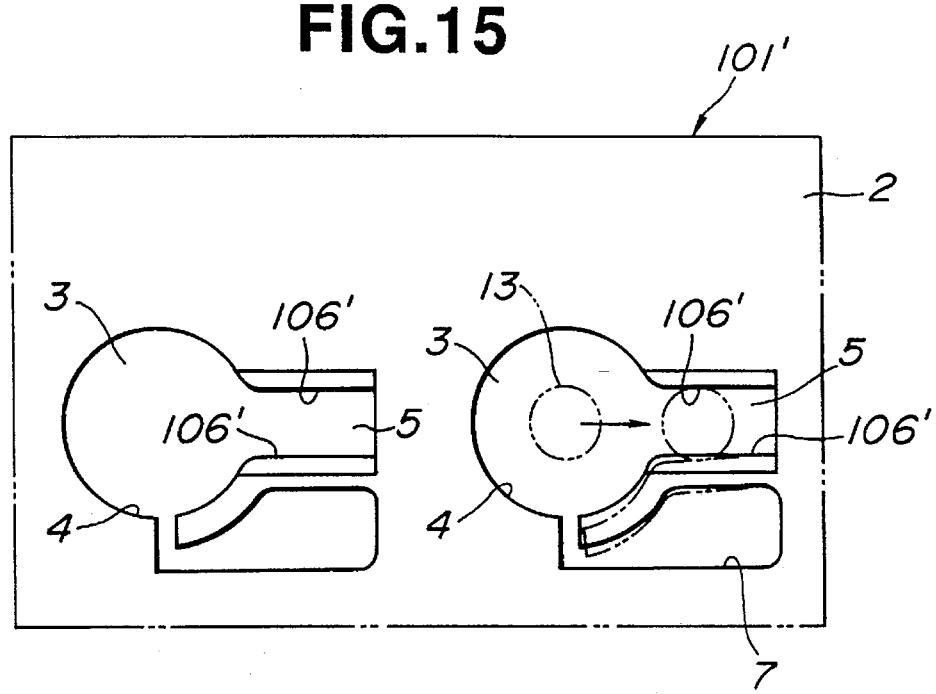
FIGS. 15 to 19 are views similar to FIGS. 7 to 11, respectively but shows further embodiments of the present invention.
Figure 16:
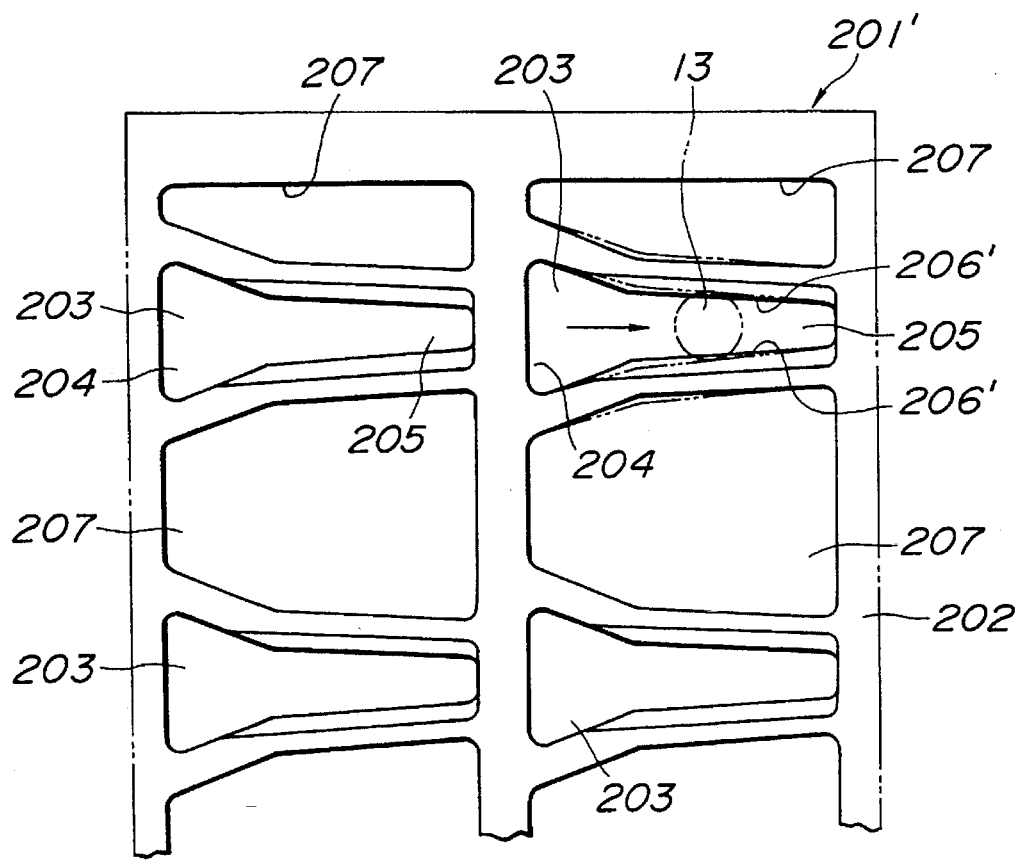
Figure 17:
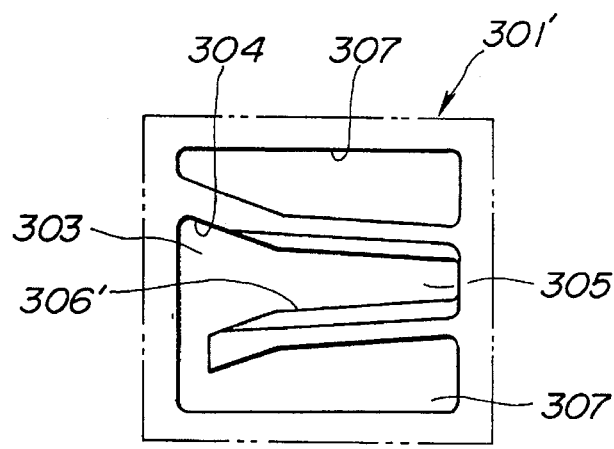
Figure 18:
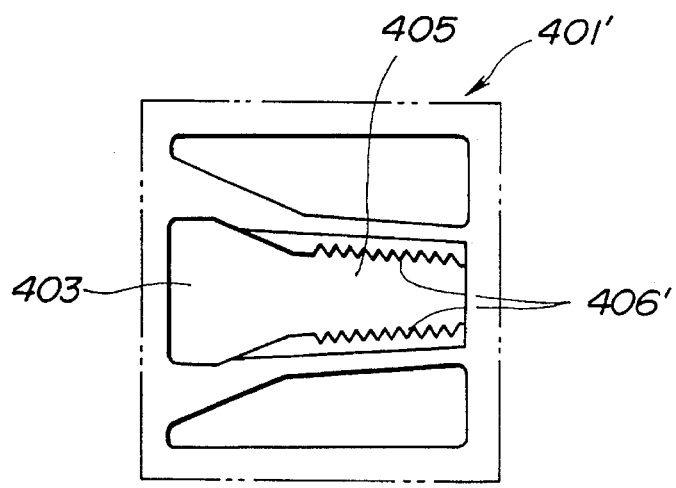

FIGS. 14A to 14E show various variants of the edge 6' of FIGS. 13A to 13C. That is, the edges 6' in FIG. 14A are obtained by forming oblique faces at only the upper side surfaces of the sheet member 2 adjacent the edges 6, which oblique faces are concavely curved, whereas the edges 6' in FIG. 14B are obtained by oblique surfaces which are convexly curved. In FIG. 14C, the edges 6' are obtained by forming at the upper side surfaces of the sheet member 2 adjacent the edges 6' a recess of a generally uniform depth. In FIG. 14D, the edges 6' are obtained by forming oblique faces at both the upper and lower side surfaces of the sheet member 2 adjacent the edges 6'. In the meantime, the exterior surface of the edge 6', when observed is a sectional view as shown in FIG. 14E, an enlarged view portion of FIG. 14D, may be convexly carved.

Figure 19:
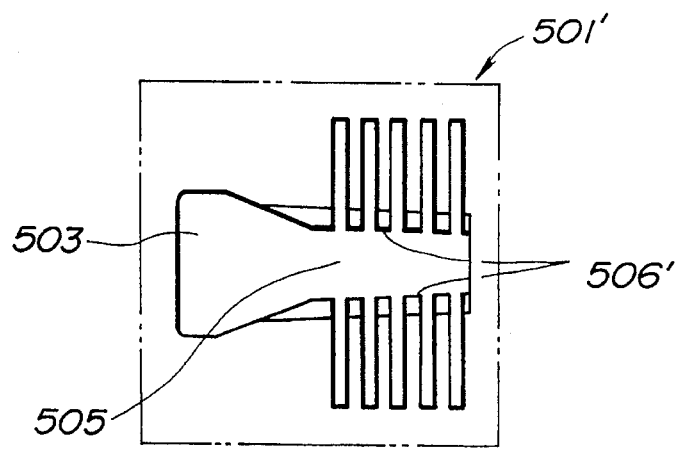

FIGS. 15 to 19 show further embodiments which are substantially similar to those of FIGS. 7 to 11, respectively except that the wall portions of the sheet member 2 adjacent the edges are chamfered or reduced in thickness so that the thickness of the edges is smaller than that of the sheet member. That is, the edges 106' in case of the jig 101' of FIG. 15, the edges 206' in case of the jig 201' of FIG. 16, the edges 306' in case of the jig 301' of FIG. 17, the edges 406' in case of the jig 401' of FIG. 18, and the edges 506' in case of the jig 501' of FIG. 19 are reduced in thickness similarly to the embodiment shown in FIGS. 13A–13C.

In the foregoing, it is to be noted that in case of putting the jig and each lead pin in contact with each other prior to the plating process the lead pin can contact the jig through movement from either of the direction coinciding with the axial direction of lead pin or direction differing from the axial direction.

It is further to be noted that the contact of each lead pin and the jig can be attained by force-fitting the lead pin in the opening formed in the jig for thereby allowing the side surface of the lead pin to be held forcedly in contact with the jig or to forcedly adhere the same.

It is further to be noted that according to the present invention, after the electroplating, each lead pin is separated from the jig through movement in the direction differing from the axial direction thereof but not necessarily in the direction perpendicular to the axial direction of the lead pin. That is, any direction in which each lead pin is moved for separation from the jig will do if it differs from the axial direction of the lead pin so that during separation the jig does not scrap off or rub off the plating applied to the side surface of the lead pin, in the direction of the generatrix.

Figure 20:
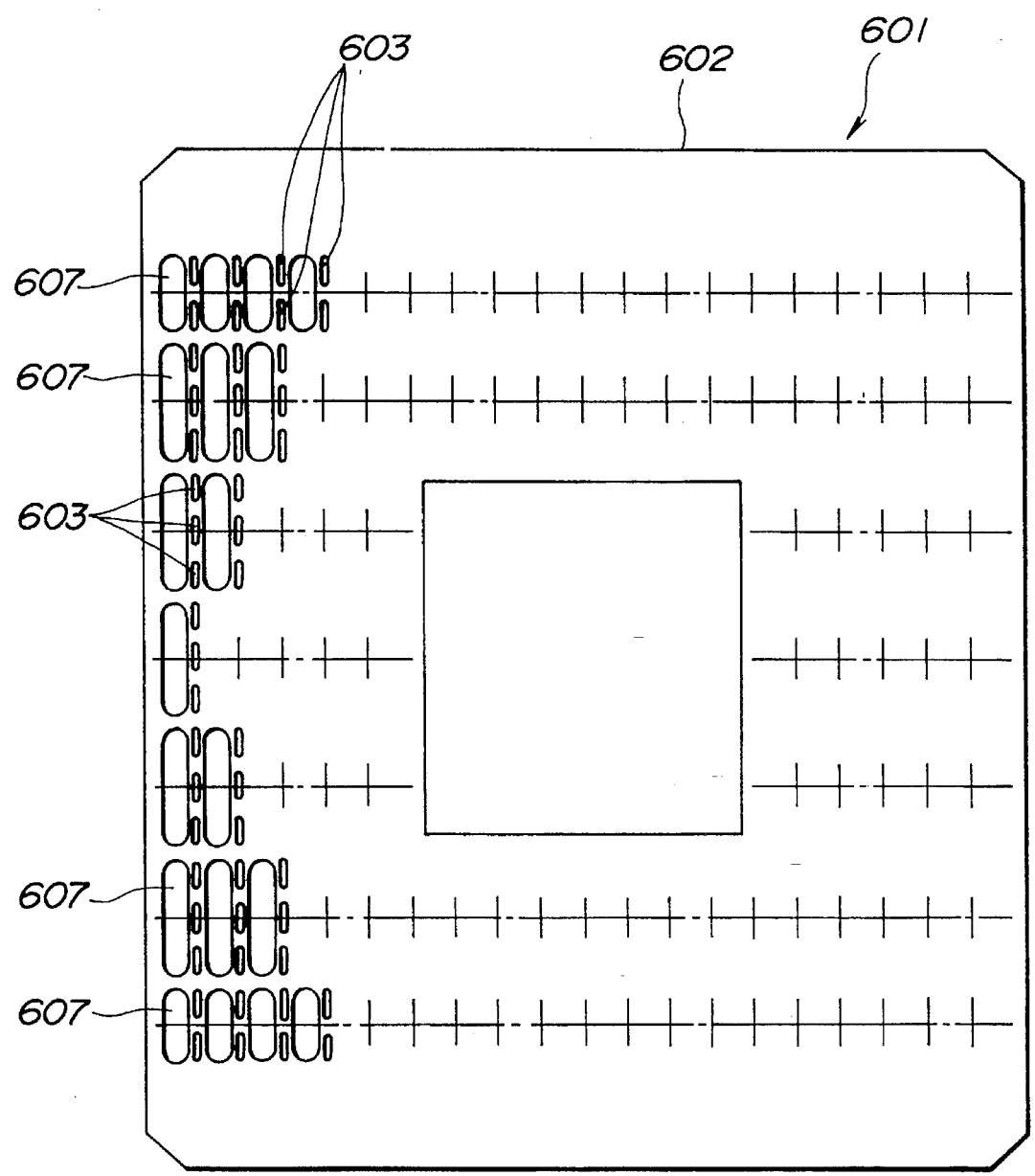
FIG. 20 is a view similar to FIGS. 1A–B but shows a jig according to a further embodiment of the present invention.
Figure 21:
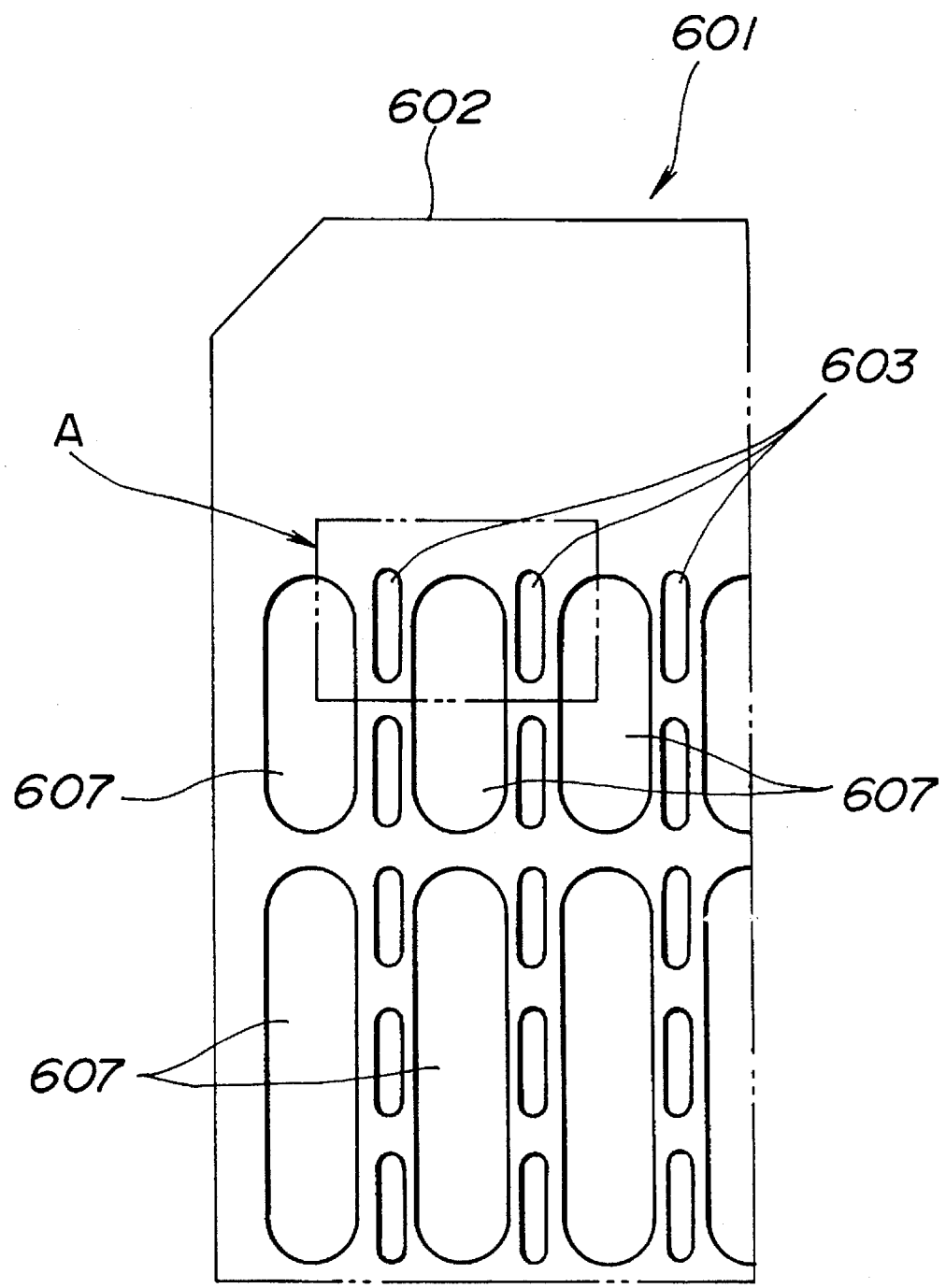
FIG. 21 is an enlarged fragementary view of the Jig of FIG. 20.

Referring to FIGS. 20 and 21, a jig according to a further embodiment is designated by 603 and is formed with a plurality of narrow, elongated openings 603 which are arranged at predetermined lengthwise and breadthwise correspondingly to the arrangement of the lead pins 13. Each opening 603 has the width "S" which is uniform and a little smaller than the diameter "D" of the lead pin 13 and the length "L" which is larger than the diameter "D" (refer to FIG. 25). The jig 603 is further formed with vacant openings 607 at opposite sides of each opening 603 so that the edges 606 of each opening 603 can resiliently bend outwards at the time of the force-fitting of the lead pin 13. The width "S" is smaller than the diameter "D" by, for example, from 0.01 mm to 0.1 mm and the length "L" is 2 mm. Except for the above, the jig 603 is substantially similar to that of FIGS. 1A–B.

Figure 22:
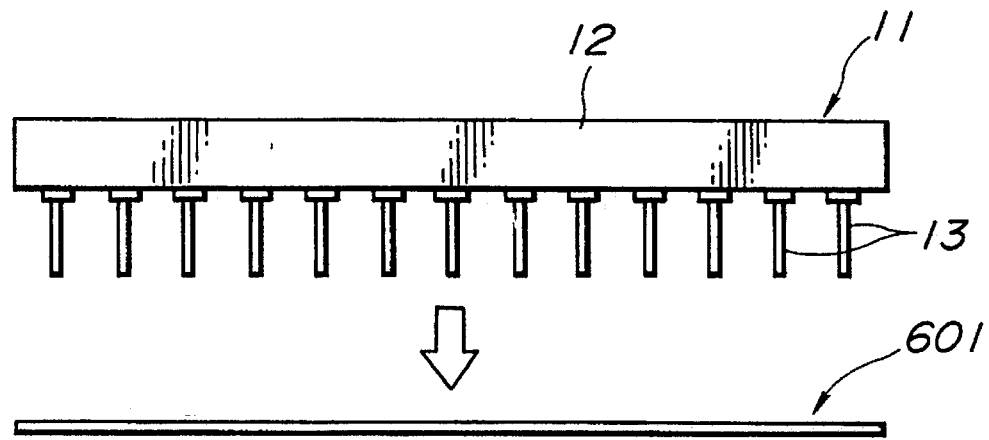
FIG. 22 is a reduced, side elevational view of the jig of FIG. 21 arranged in opposition to a package.
Figure 24:
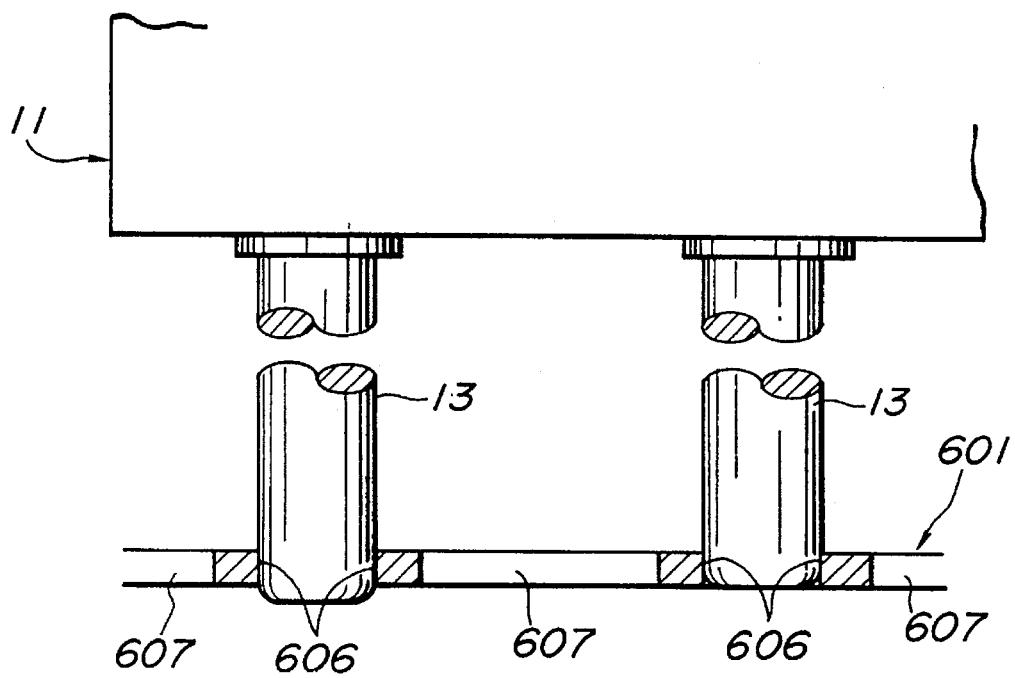
FIG. 24 is a view similar to FIG. 23 but shows the lead pins in the state after being force-fitted in the jig of FIG. 20.
Figure 25:
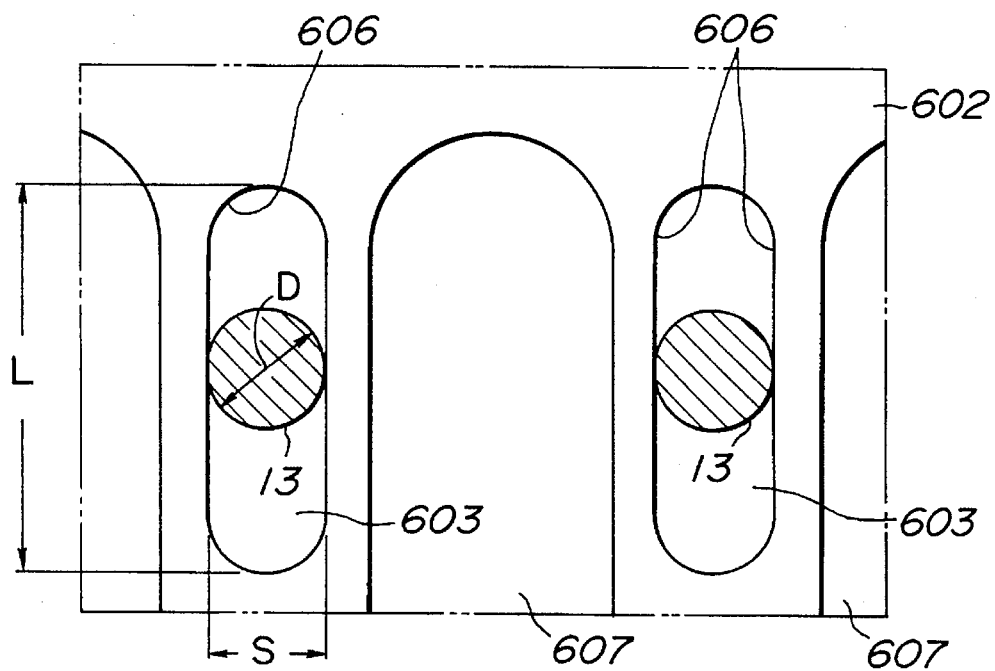
FIG. 25 is an enlarged view of a portion "A" of FIG. 21, together with the lead pins force-fitted in the opening of the jig.

Electrical connection of the lead pins 13 by using the jig 603 will be described with additional reference to FIGS. 22 and 25. Firstly, the jig 603 and the package 11 are held as shown in FIG. 22, i.e., in such a manner that the lead pins 13 have the end faces opposed in parallel to the upper side surface of the jig 601 and are aligned with the openings 603. Then, the package 11 is pushed hard vertically downwards, i.e., in the axial direction of the lead pins 13 toward the jig 601. By this, each lead pin 13 is force-fitted in the opening 603, so that the edges 606 of each opening 603 are forced to contact the side or circumferential surface of each lead pin 13 at two places to obtain the electrical connection between the jig 603 and each lead pin 13 (refer to FIGS. 24 and 25).

Figure 23:
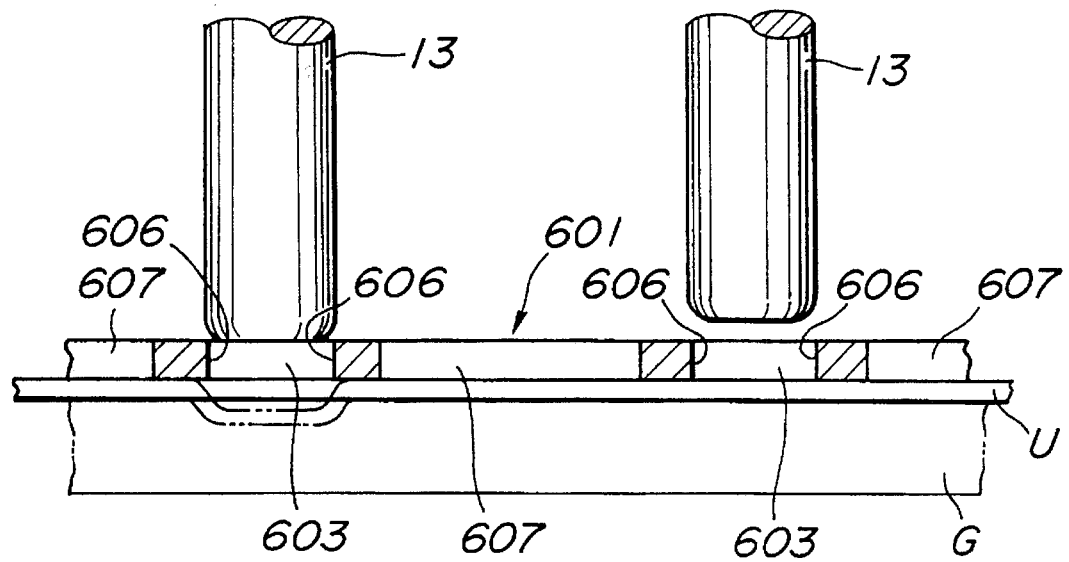
FIG. 23 is an enlarged, fragmentary view of the lead pins of the package in the state prior to being force-fitted in the jig of FIG. 20.

In the meantime, since the opening 603 in this embodiment is narrow and elongated, it can effect a larger tolerance for a positional error in of the end of each lead pin 13 with respect to a plan view, so that the setting or force-fitting of the lead pins relative to the jig can be attained with ease. Further as shown in FIG. 23, it is desirable to perform the force-fitting under a condition in which a thin film "U" of polyester or the like having both the strength and flexibility is interposed between the jig 601 and a rubber plate "G". By this, a larger tolerance for a positional error of the end of each lead pin 13 with respect to a plane view can be attained by the effect of the elasticity of the rubber plate "G", thus making it possible to the force-fitting of the lead pins 13 with ease and making it possible to prevent the end of each lead pin 13 from being damaged during the force-fitting. In the meantime, the thin film "U" is provided with view to preventing damage of the rubber plate "G".

By using the jig 601, an electroplating process can be performed similarly to the previous embodiment of FIGS. 1A to 6. After the electroplating process, a force is applied to each lead pin 13 in the direction opposite to that in case of the force-fitting so that the lead pins 13 are separated from the jig 601.

This embodiment can reduce the contact area of the jig and each lead pin since the jig is adapted to contact the side surface of each lead pin at only two places. Further, this embodiment can make easier the setting of the jig since the elongated opening can effect a larger tolerance for a positional error of the end of each lead pin with respect to a plan view.

Figure 26A:
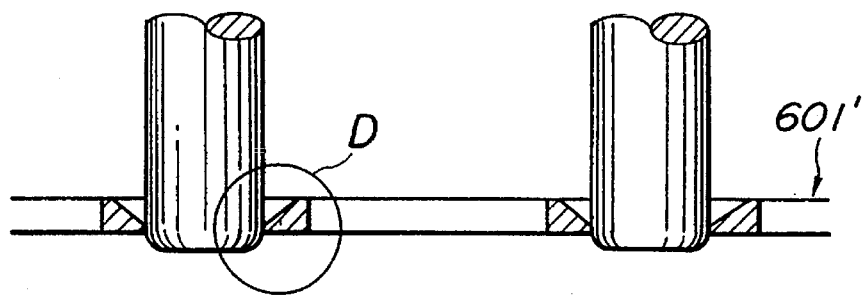
Figure 26B:
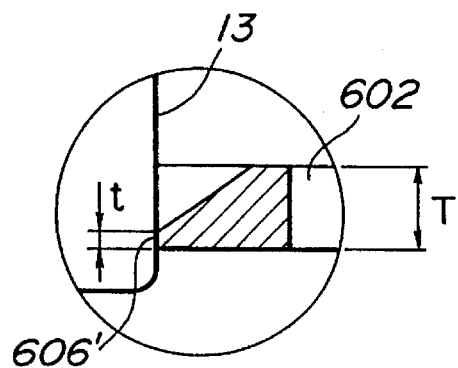
FIG. 26B shows the enlarged view of portion D from FIG. 26A, together with the lead pins fitted in the opening of the jig.
Figure 27:
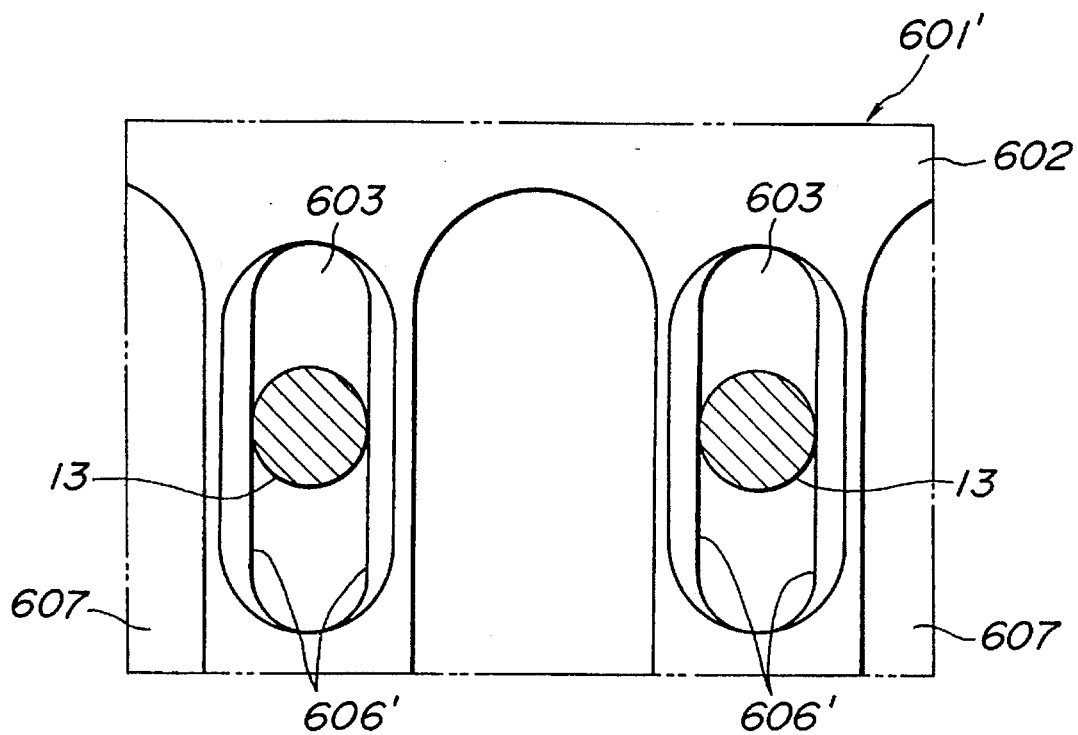
FIG. 27 is a plan view corresponding to FIGS. 26A–B.

FIGS. 26A–B and 27 show a modification in which the edges 606' of each opening 603 are chamfered on the upper surface of the jig 601' so that the thickness "t" of the edges 601' is smaller than the thickness "T" of the sheet member 602. This embodiment can produce substantially the same effect as the previous embodiment of FIGS. 13A to 13C.

What is claimed is:

1. A plating jig used for carrying out a method of producing an integrated circuit package, wherein portions of the package are electroplated by getting a direct electrical connection with each of lead pins joined to a package substrate, characterized in that said direct electrical connection is obtained by bringing a side surface of each of said lead pins in contact with a plating jig, said portions of said package are electroplated under the condition where each of said lead pins is held in conduction, and thereafter each of said lead pins is separated from said plating jig through movement in a direction diverging from an axial direction of each of said lead pins, said plating jig being formed from a sheet of metal that is electrically conductive and comprising:

a plurality of openings arranged correspondingly to said lead pins;

each of said openings consisting essentially of a loose-fit opening section in which each of said lead pins can be held loose and a force-fit opening section in which each of said lead pin can be force-fitted.

2. A plating jig according to claim 1, wherein said force-fit opening section is a narrow, elongated opening of a uniform width which is smaller than an outer diameter of each of said lead pin.

3. A plating jig according to claim 1, wherein said force-fit opening section is a narrow, elongated opening which is tapered in the direction in which each of said lead pins is moved for force-fitting in said force-fit opening section.

4. A plating jig according to claim 1, further comprising a vacant opening arranged adjacently outside of an edge of said force-fit opening section for enabling said edge to resiliently deform outwards when each of said lead pins is force-fitted in said force-fit opening section.

5. A plating jig according to claim 1, wherein said force-fit opening section has an edge which is in the form of a cantilever and capable of resiliently bending outwards when each of said lead pins is force-fitted in said force-fit opening section.

6. A plating jig according to claim 1, wherein said force-fit opening section of each of said openings comprises an edge for contact with each of said lead pins, said edge being of the thickness which is smaller than that of said sheet of metal.

7. A plating jig according to claim 1, wherein said force-fit opening section of each of said openings comprises a pair of edges for contact with each of said lead pins, said edges being tapered in the direction away from said loose-fit opening section.

8. A plating jig according to claim 7, wherein each of said edges is serrated.

9. A plating jig according to claim 7, wherein each of said edges has a shape like teeth of a comb.

10. A plating jig for use in electroplating predetermined portions of a package, formed from a sheet of metal and comprising:

a plurality of openings in which lead pins are to be force-fitted, formed in said sheet in a predetermined arrangement;

each of said openings being a narrow, elongated opening having a width smaller than an outer diameter of each of said lead pins and a length larger than said outer diameter; and a vacant opening arranged adjacently outside at least one edge of said opening for enabling said at least one edge to resiliently deform outwards when each of said lead pins is force-fitted in each of said openings.

11. A plating jig according to claim 10, wherein each of said openings comprises an edge for contact with a respective one of said lead pins, said edge being of the thickness which is smaller than that of said sheet of metal.

12. A plating jig used for carrying out a method of producing an integrated circuit package, wherein portions of said package are electroplated by getting a direct electrical connection with each of lead pins joined to a package substrate, characterized in that said direct electrical connection is obtained by force-fitting each of said lead pins in corresponding one of a plurality of openings formed in a plating jig for bringing a side surface of each of said lead pins in contact with said jig, said portions of said package are electroplated under the condition where each of said lead pins is held in conduction, and thereafter each of said lead pins is separated from said plating jig through movement in a direction diverging from an axial direction of each of said lead pins, said plating jig being formed from a sheet of metal that is electrically conductive and comprising:

a plurality of openings arranged correspondingly to said lead pins;

each of said openings consisting essentially of a loose-fit opening section in which each of said lead pins can be held loose and a force-fit opening section in which each of said lead pin can be force-fitted.

13. A plating jig according to claim 12, wherein said force-fit opening section is a narrow, elongated opening of a uniform width which is smaller than an outer diameter of each of said lead pin.

14. A plating jig according to claim 12, wherein said force-fit opening section is a narrow, elongated opening which is tapered in the direction in which each of said lead pins is moved for force-fitting in said force-fit opening section.

15. A plating jig according to claim 12, further comprising a vacant opening arranged adjacently outside of an edge of said force-fit opening section for enabling said edge to resiliently deform outwards when each of said lead pins is force-fitted in said force-fit opening section.

16. A plating jig according to claim 12, wherein said force-fit opening section of each of said openings comprises an edge for contact with each of said lead pins, said edge being of the thickness which is smaller than that of said sheet of metal.

17. A plating jig according to claim 12, wherein said force-fit opening section of each of said openings comprises a pair of edges for contact with each of said lead pins, said edges being tapered in the direction away from said loose-fit opening section.

* * * * *